United States Patent
Stolze et al.

(10) Patent No.: US 6,715,203 B2
(45) Date of Patent: Apr. 6, 2004

(54) SUBSTRATE FOR POWER SEMICONDUCTOR MODULES WITH THROUGH-PLATING OF SOLDER AND METHOD FOR ITS PRODUCTION

(75) Inventors: Thilo Stolze, Arnsberg (DE); Manfred Loddenkoetter, Ibbenbüren (DE)

(73) Assignee: EUPEC Europaeische Gesellschaft fuer Leistungshalbleiter mbH & Co. KG, Warsteinbelecke (DE)

( * ) Notice: Subject to any disclaimer, the term of this patent is extended or adjusted under 35 U.S.C. 154(b) by 0 days.

(21) Appl. No.: 09/789,341

(22) Filed: Feb. 20, 2001

(65) Prior Publication Data

US 2001/0022236 A1 Sep. 20, 2001

(30) Foreign Application Priority Data

Feb. 18, 2000 (DE) .......................... 100 07 414

(51) Int. Cl.⁷ ................................ H05K 3/00
(52) U.S. Cl. ...................... 29/843; 228/101; 228/122.1
(58) Field of Search ................ 29/843, 840, 830; 228/101, 122.1, 124.5; 428/901, 615, 621, 627, 688, 689, 698, 457, 469, 472, 545, 699

(56) References Cited

U.S. PATENT DOCUMENTS

| | | | |
|---|---|---|---|
| 4,360,570 A | * | 11/1982 | Andreades et al. ..... 428/901 X |
| 4,610,756 A | * | 9/1986 | Strobel |
| 4,699,310 A | * | 10/1987 | Kohno et al. |
| 4,700,473 A | * | 10/1987 | Freyman et al. .......... 29/830 X |
| 4,857,411 A | * | 8/1989 | Yamaguchi et al. |
| 4,859,541 A | * | 8/1989 | Maxeiner et al. ........... 428/545 |
| 4,918,811 A | * | 4/1990 | Eichelberger et al. ....... 29/840 |
| 5,043,223 A | * | 8/1991 | Kumagai et al. ....... 428/699 X |
| 5,241,216 A | * | 8/1993 | Webster ............... 228/122.1 X |
| 5,401,911 A | * | 3/1995 | Anderson et al. ......... 29/830 X |
| 5,465,898 A | * | 11/1995 | Schulz-Harder et al. . 228/122.1 |
| 5,747,358 A | * | 5/1998 | Gorrell et al. |
| 5,769,989 A | * | 6/1998 | Hoffmeyer et al. ..... 428/901 X |
| 5,785,800 A | * | 7/1998 | Natarajan et al. ....... 428/901 X |
| 6,121,553 A | * | 9/2000 | Shinada et al. ......... 428/901 X |
| 6,239,382 B1 | * | 5/2001 | Suhir |
| 6,284,985 B1 | * | 9/2001 | Naba et al. |
| 6,562,657 B1 | * | 5/2003 | Lin |
| 6,562,709 B1 | * | 5/2003 | Lin |
| 6,587,008 B2 | * | 7/2003 | Hatanaka et al. |

FOREIGN PATENT DOCUMENTS

| | | |
|---|---|---|
| DE | 4338706 A1 | 5/1995 |
| DE | 19802347 A1 | 4/1999 |
| JP | 57-31198 | 2/1982 |
| JP | 61-193496 | 8/1986 |
| JP | 04 091 494 A | 3/1992 |
| JP | WO 93/26144 | 12/1993 |

* cited by examiner

Primary Examiner—Ljiljana Ciric

(57) ABSTRACT

A substrate for power semiconductor modules with a through-plating of solder, includes two metal plates and a ceramic plate which is seated as a layer between the metal plates and has a through hole formed therein. The substrate is plated through by making a through hole in one of the metal plates in alignment with the through hole in the ceramic plate and applying a paste solder to one side of the substrate. The substrate is then subjected to a furnace step, so that the paste solder flows into the through holes and the solder makes a permanent contact between the two metal plates. A method for producing the substrate is also provided.

7 Claims, 4 Drawing Sheets

SUBSTRATE FOR POWER SEMICONDUCTOR MODULES WITH THROUGH-PLATING OF SOLDER AND METHOD FOR ITS PRODUCTION

BACKGROUND OF THE INVENTION

FIELD OF THE INVENTION

The invention relates to a method for through-plating a substrate for power semiconductor modules having two metal plates and a ceramic plate which is held as a layer between the metal plates and has a through hole. The invention also relates to a substrate for power semiconductor modules, having two metal plates and a ceramic plate held as a layer between the metal plates. One of the metal plates and the ceramic plate each have through holes aligned with one another, and a solder makes contact between the two metal plates.

In recent years, power semiconductors have been widely used in automobile electronics, power management and increasingly in industrial drive and automation technology as well. Those power semiconductors are generally combined to form modules which are tailored to customer-specific requirements.

In such power semiconductor modules, individual electronic components are generally mounted on a substrate. Such a substrate is usually produced in the form of a sandwich, with a ceramic plate being seated as a layer between two outer metal plates. Those metal plates are generally made of copper, since that material has very good properties in terms of electrical conductivity and thermal conductivity. Such a substrate having the copper/ceramic/copper sandwich is referred to below as a "DCB substrate".

In order to produce such DCB substrates, the copper plates are oxidized thoroughly and are placed onto the ceramic plate. The copper/ceramic/copper sandwich formed in that way is then heated to approximately 1000° C. during a furnace step, and a copper oxide/alumina eutectic produced in the course thereof joins (bonds) the individual layers inseparably to one another. In order to solder the electrical components, a structure is typically etched into a copper plate, with the other copper plate being soldered onto a base plate (heat sink) for better dissipation of heat.

In other variants of such power semiconductor modules, it may also be necessary to discharge potentials from the known DCB substrates on both sides. In that case, a conductive connection between the two outer copper plates is required, and that is produced through the use of a plated-through hole.

In the known DCB substrates, such a plated-through hole is produced by making a through hole in the ceramic plate. In addition, a separate part is inserted into that hole manually before the sandwich is bonded. Preferably, a copper ball is used for that purpose. However, positioning the copper ball has a first disadvantage which is that the through hole in the ceramic needs to be very precise in order to hold the copper ball exactly, which may be achieved by using a complex laser separation method, for example. Furthermore, separate insertion of the copper ball represents an additional work step as well as an additional material requirement.

An alternative possibility is to press the copper plates together in the through hole in the ceramic plate as a modification of inserting a separate part. Permanent contact between the two plates is then ensured by spot welding. However, that option results in the disadvantage of an increased equipment requirement due to the welding equipment, and the welding operation means that the energy balance of that option is very poor. Both of the aforementioned methods are also very time consuming and costly.

SUMMARY OF THE INVENTION

It is accordingly an object of the invention to provide a substrate for power semiconductor modules with a through-plating of solder and a method for its production, which overcome the hereinafore-mentioned disadvantages of the heretofore-known products and methods of this general type and in which the through-plating is simple and economical to produce.

With the foregoing and other objects in view there is provided, in accordance with the invention, a method for through-plating a substrate for power semiconductor modules, which comprises providing two metal plates and a ceramic plate with a through hole. The ceramic plate is seated as a layer between the two metal plates and a through hole is formed in one of the metal plates in alignment with the through hole in the ceramic plate. A paste solder is applied to one side of the substrate. A furnace step causes the paste solder to flow into the through holes and make a permanent contact between the two metal plates with solder.

The method according to the invention is advantageously used for the DCB substrates explained in the introduction. Structures are etched into the surface of such a substrate, and further electronic components are soldered onto these structures in a subsequent step. In this context, during this etching operation it is advantageous to produce the through holes in one of the copper plates at the same time that the structures are etched. In this way, two method steps can be combined into one step, which makes for efficient production.

A paste solder is applied to the substrate before the electrical components are soldered. In this case, the paste solder also reaches the point at which the through hole is made in the copper plate. Thus, during a furnace step, in which the electrical components are soldered to the substrate at the same time, the paste solder can flow through the through hole in the copper plate into the through hole in the ceramic plate in order to reach the surface of the other copper plate and therefore make contact between the two copper plates.

In accordance with another mode of the invention, a punch, for example in the form of a truncated cone, comes down onto the substrate after etching, as a result of which an inner border the through hole formed in the top copper plate is shaped into the through hole in the ceramic plate. This advantageously ensures a better flow of the paste solder into the through hole in the ceramic plate in the direction of the other copper plate.

In accordance with a further mode of the invention, in a modification to the etching method described above, the through hole in the top copper plate may advantageously also be formed directly as a result of the punch coming down. In this case, the end of the punch which faces the substrate is in the shape of a pointed cone, for example. Since the copper plate has only a relatively small thickness, the tip of this punch can easily penetrate the copper plate and thereby form the through hole.

In accordance with an added mode of the invention, the through hole in the copper plate has a smaller diameter than the through hole in the ceramic plate. In terms of the running of the solder, an exact tolerance level for the through hole in the ceramic plate is unimportant in this case. Consequently, the desired through holes can be made in the ceramic plate through the use of punching before the ceramic plate is bonded to the oxidized copper plates to form the sandwich substrate.

With the objects of the invention in view, there is also provided a substrate for power semiconductor modules, comprising two metal plates and a ceramic plate seated as a layer between the metal plates. One of the metal plates and the ceramic plate each have a respective, mutually aligned through hole formed therein. A solder makes contact between the two metal plates. The other of the metal plates has a continuous structure without any through holes aligned with the mutually aligned through holes in the one metal plate and in the ceramic plate. That forms a receiving region for the solder which is closed off at one end, together with the mutually aligned through holes in the one metal plate and in the ceramic plate.

Other features which are considered as characteristic for the invention are set forth in the appended claims.

Although the invention is illustrated and described herein as embodied in a substrate for power semiconductor modules with a through-plating of solder and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
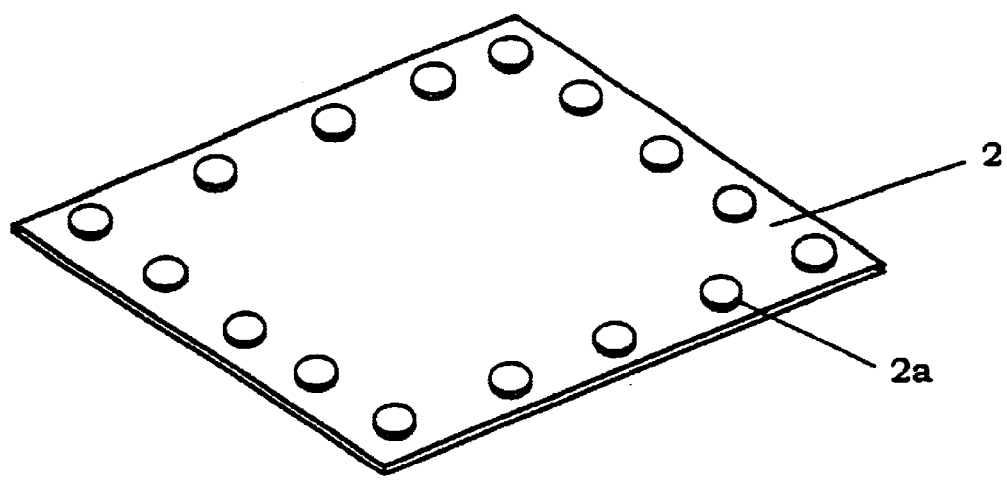
FIG. 1 is a diagrammatic, perspective view of a ceramic plate which is provided with through holes.

Referring now to the figures of the drawings in detail and first, particularly to FIG. 1 thereof, there is seen a perspective illustration of a ceramic plate 2 which is usually used for substrates. In this illustrative embodiment which is shown in the figure, the ceramic plate 2 has a multiplicity of through holes 2a which, by way of example, are oriented along edges of the ceramic plate 2. The large number of through holes 2a shown in this figure can be made in the ceramic plate 2 very efficiently, for example through the use of a punching operation before firing.

Figure 2:
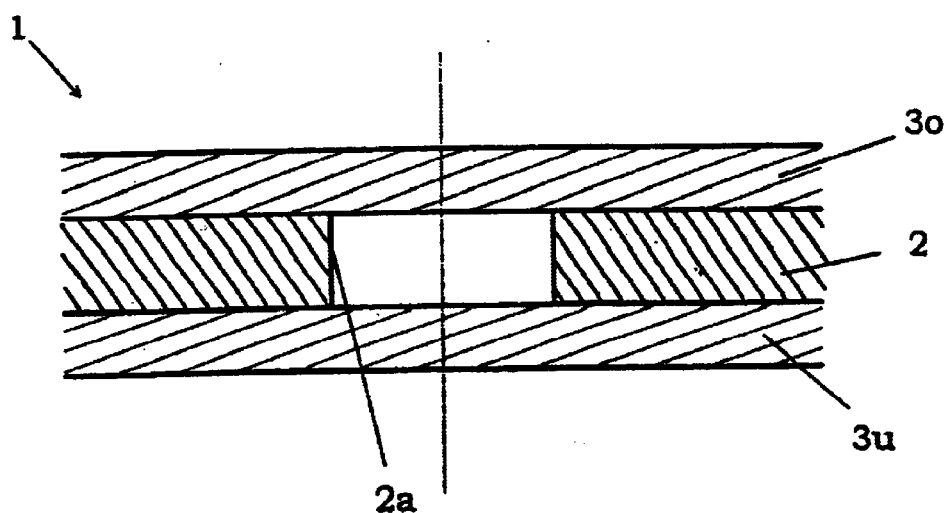
FIG. 2 is an enlarged, fragmentary, lateral cross-sectional view of a substrate which is formed from the ceramic plate shown in FIG. 1 and two metal plates.

FIG. 2 shows a substrate 1 in a lateral cross-sectional view. In this case, the ceramic plate 2 is held as a layer between two metal plates 3o, 3u. These metal plates 3o, 3u are usually made of copper, which is why the substrate is referred to as a DCB substrate below. In order to produce this DCB substrate, the copper plates are oxidized thoroughly and are placed onto the ceramic plate, so that a formation of copper oxide/alumina eutectic produces an inseparable copper/ceramic/copper sandwich. In each case the through holes 2a are made in the ceramic plate 2 before the ceramic plate 2 is bonded to the copper plates 3o, 3u.

The individual layers of the substrate in the form shown herein have different thicknesses. The ceramic plate 2 in the middle typically has a thickness of 0.25 mm–1 mm, and the outer copper plates 3o, 3u have a relatively small thickness, as compared with the ceramic plate 2, of approximately 300 µm. Thus, the ceramic plate 2 forms a main support layer of the substrate 1. However, the thicknesses of the respective plates are not fixed at the values indicated, but instead can be different than those values within certain limits.

Figure 3:
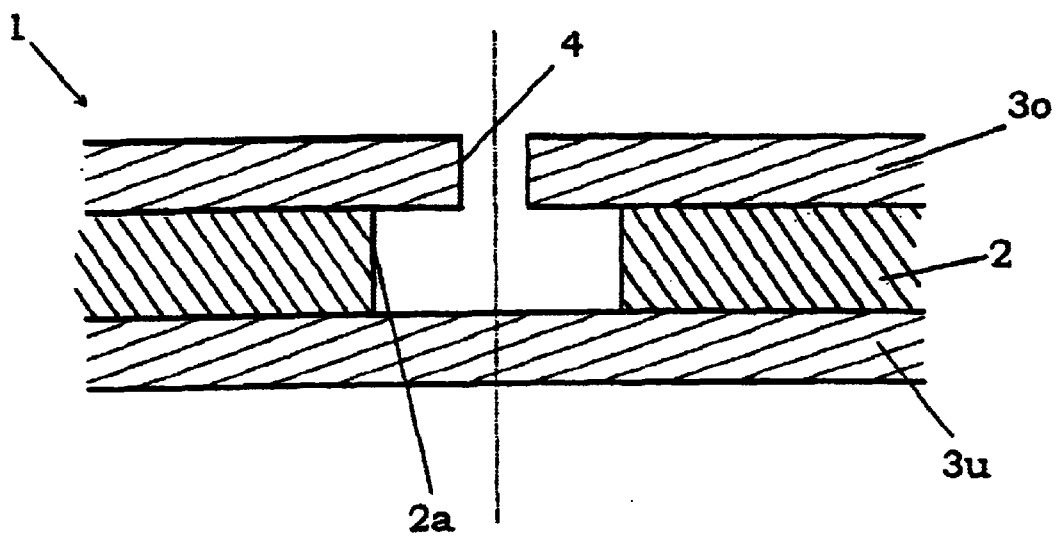
FIG. 3 is a fragmentary, lateral cross-sectional view of the substrate, in which one of the metal plates has a through hole in alignment with the through hole in the ceramic plate.

FIG. 3 shows a lateral cross-sectional view of the substrate 1 after a further method step. The illustration shows that the top copper plate 3o has a through hole 4 formed therein. In this illustrative embodiment of the substrate 1, the through hole 4 is formed by etching the copper. The through hole 4 has a smaller diameter than the through hole 2a and is aligned centrally with the latter.

Figure 4:
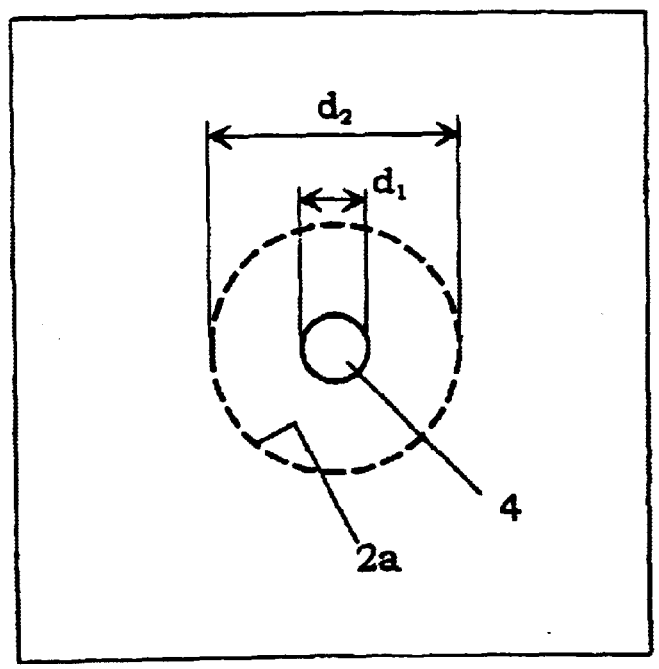
FIG. 4 is a plan view of the substrate.

FIG. 4 shows a plan view of the illustrative embodiment of the substrate 1 which is shown in FIG. 3. As can be seen, a diameter $d_2$ of the through hole 2a is larger than a diameter $d_1$ of the through hole 4. By way of example, the diameter $d_1$ is 0.8 mm and the diameter $d_2$ is 2 mm. Both of the through holes 2a and 4 have a circular shape, but a shape which is different than this is possible, for example in the form of an oval or a rectangle.

Figure 5:
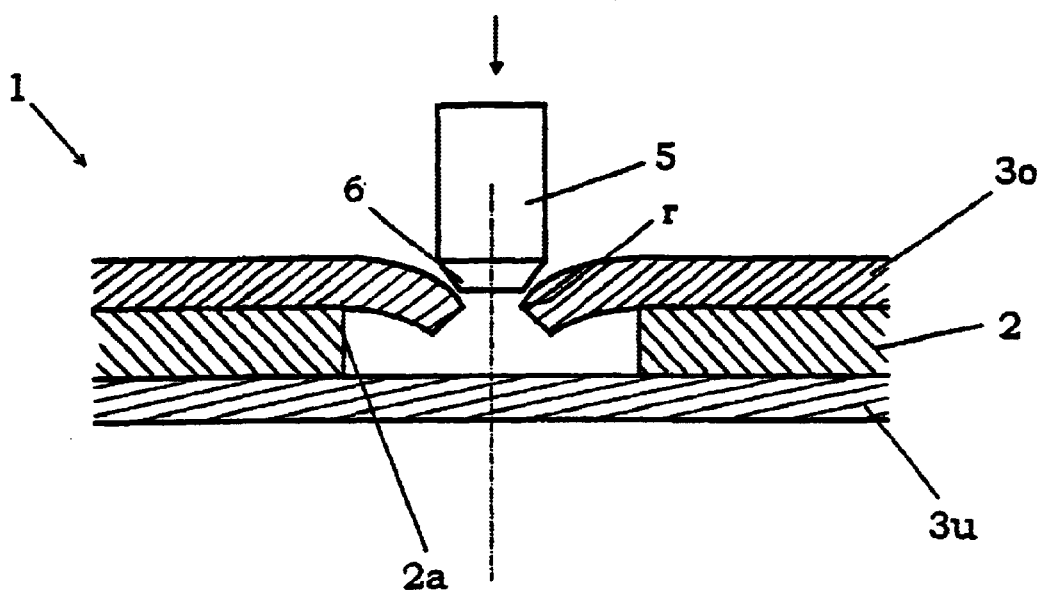
FIG. 5 is a fragmentary, cross-sectional view of the substrate together with a punch.

FIG. 5 shows the illustrative embodiment of the substrate 1 shown in FIG. 3 and FIG. 4, together with a punch 5 used for further processing the substrate 1. An end of the punch 5 which faces the substrate has a portion 6 in the form of a truncated cone. After the through hole 4 has been etched, the punch 5 is brought down in a subsequent processing step, so that the top copper plate 3o at an inner border r of the through hole 4 is shaped into the through hole 2a by the portion 6 of the punch 5.

Figure 6:
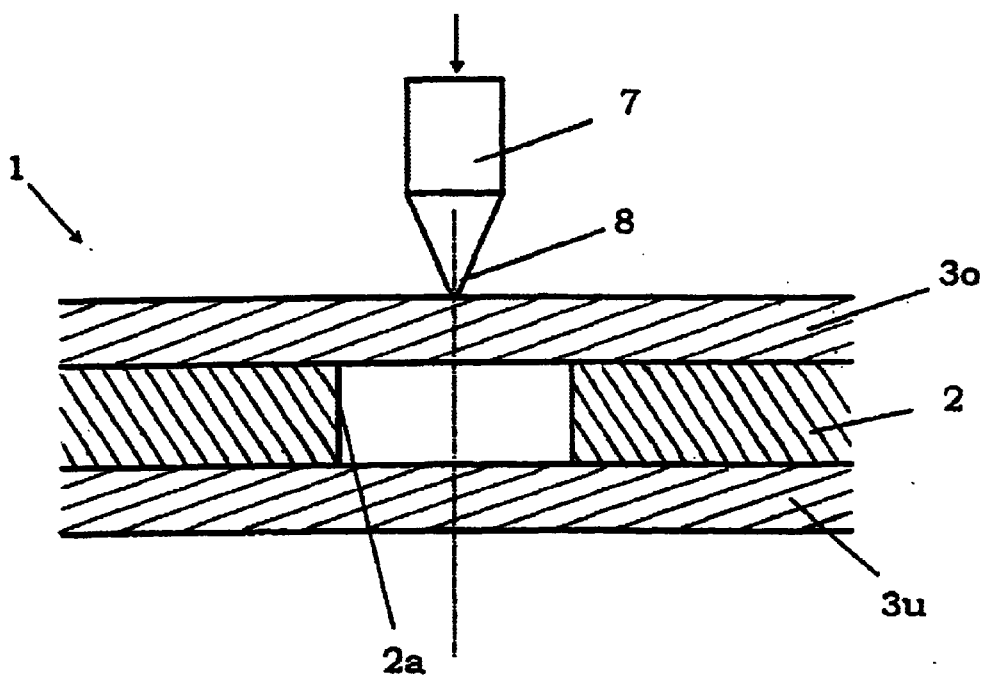
FIG. 6 is a fragmentary, cross-sectional view of another illustrative embodiment of the substrate together with another punch.

FIG. 6 shows a lateral cross-sectional view of another illustrative embodiment of the substrate 1. In contrast with the illustrative embodiment shown in FIG. 3, the through hole 4 is not etched in this case, but instead a punch 7 penetrates the top copper plate 3o as it comes down. In addition to the comparatively small thickness of the copper plates of approximately 300 µm, a portion 8 of the punch 7 in the form of a pointed cone on the end which faces the substrate 1 ensures that the copper plate 3o is easily penetrated as the punch 7 comes down.

Figure 7:
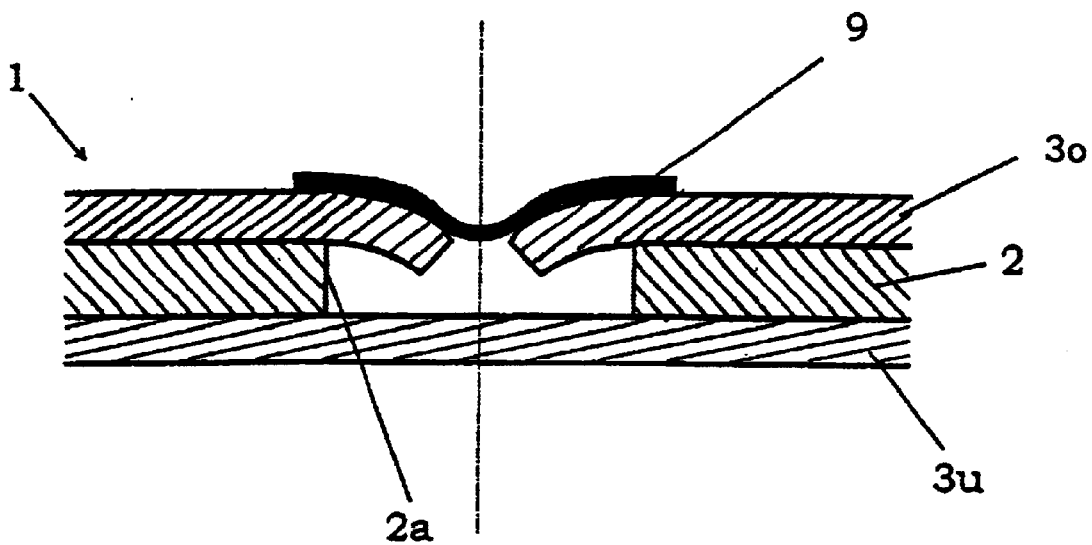
FIG. 7 is a fragmentary, lateral cross-sectional view of the substrate with paste solder applied.

When the through hole 4 has been made in the top copper plate 3o, a paste solder 9 is printed on the substrate 1, as is seen in FIG. 7. If a non-illustrated solder print template having an appropriate pad cut out of it is used, the paste solder 9 then also reaches a point at which the through hole 4 is made in the top copper plate 3o. As can be seen in FIG. 7, the printed paste solder does not lie flat on the substrate 1, but instead is matched to the contour formed by pressing down the top copper plate 3o at the inner border r of the through hole 4. This ensures that when the solder subsequently runs it enters the through hole 2a fully and reaches the surface 10 of the bottom copper plate 3u.

Figure 8:
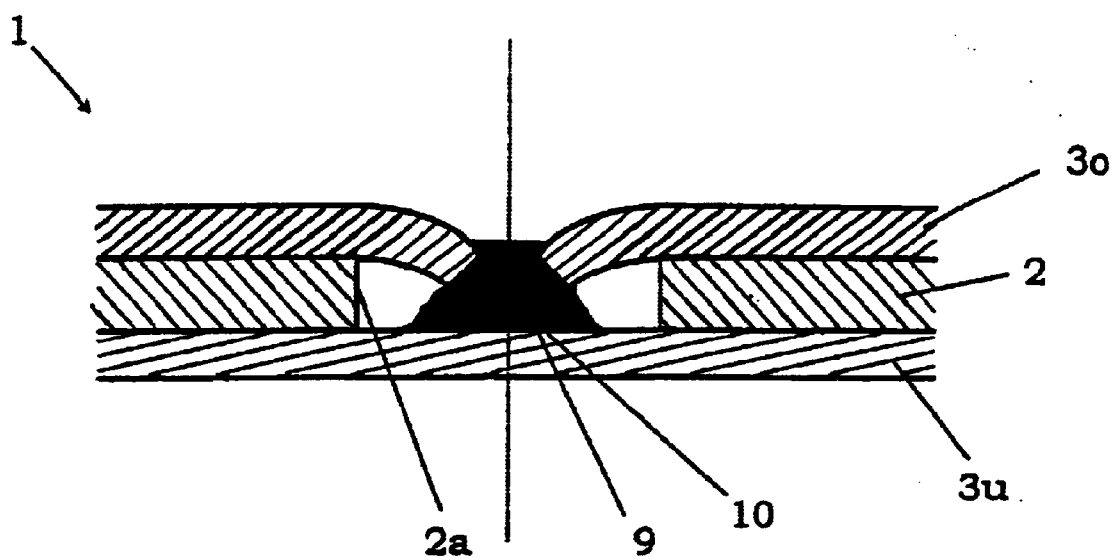
FIG. 8 is a fragmentary, lateral cross-sectional view of the substrate with paste solder which has run.

FIG. 8 shows a lateral cross-sectional view of the substrate 1 in a state which is established after a furnace step. The heat introduced during the furnace step has caused the paste solder 9 applied to the substrate 1 to run completely, which is shown in FIG. 8 through the use of a solid area. The solder 9 wets the surface 10 of the bottom copper plate 3o and the borders r of the through hole 4 made in the top copper plate 3o in the same way. This ensures that the substrate 1 is plated through permanently.

As a result of the through hole 4 which is provided in one of the copper plates of the known DCB substrate 1 according to the invention, it is thus possible to provide for a paste solder 9 applied to the DCB substrate 1 to run into a through hole 2a made in the ceramic plate 2 of the DCB substrate 1 during a furnace heating step which needs to be carried out anyway. This means that the DCB substrate 1 is plated through simply and economically. Other electronic components 11 can also be connected to the substrate during the furnace heating step (see FIG. 2).

We claim:

1. A method for through-plating a substrate for power semiconductor modules, which method comprises:

providing two metal plates, each having an outer surface;

providing a ceramic plate with a through hole;

seating the ceramic plate as a layer between the two metal plates, thereby forming a layer stack including a lower metal plate, the ceramic plate, and an upper metal plate;

forming a through hole in the upper metal plate in alignment with the through hole in the ceramic plate, a diameter of the through hole in upper metal plate being smaller than a diameter of the through hole in the ceramic plate;

reshaping an inner edge of the through hole of the upper metal plate by a punch punching into the through hole of the ceramic plate without reaching the lower metal plate;

applying a paste solder to the outer surface of the upper metal plate in the region of the through hole in the upper metal plate; and carrying out a furnace heating step causing the paste solder to flow into the through holes and the two metal plates to be permanently contacted with one another only by the solder.

2. The method according to claim 1, which further comprises carrying out the step of forming the through hole in the upper metal plate by etching the upper metal plate.

3. The method according to claim 1, which further comprises carrying out the step of forming the through hole in the upper metal plate by penetrating the upper metal plate with a punch.

4. The method according to claim 1, which further comprises connecting electronic components to the substrate during the furnace heating step.

5. A substrate for power semiconductor modules, the substrate comprising:

two metal plates;

a ceramic plate seated as a layer between said two metal plates, thus forming a layer stack including a lower metal plate, the ceramic plate, and an upper metal plate;

said upper metal plate being formed with a though hole with a first diameter and an inner edge, said ceramic plate having a through hole with a second diameter, said through hole of said metal plate and said though hole of said ceramic plate being mutually aligned, said first diameter being smaller than said second diameter, said inner edge being reshaped into said through hole of said ceramic plate without reaching the lower metal plate;

a solder making contact between said two metal plates; and said lower metal plates having a continuous structure without any through holes to form, together with said mutually aligned through holes in said upper metal plate and in said ceramic plate, a receiving region for said solder.

6. The substrate according to claim 5, wherein said metal plates are formed of copper.

7. The substrate according to claim 6, wherein said through hole in said upper metal plate has a circular shape in cross-section.

* * * * *